United States Patent [19]

Walkup

[11] Patent Number: 5,167,512
[45] Date of Patent: Dec. 1, 1992

[54] MULTI-CHIP MODULE CONNECTOR ELEMENT AND SYSTEM

[76] Inventor: William B. Walkup, 79 Balance Rock Rd., Apt. 22, Seymour, Conn. 06483

[21] Appl. No.: 726,022

[22] Filed: Jul. 5, 1991

[51] Int. Cl.⁵ .............................................. H05K 1/00
[52] U.S. Cl. ........................................ 439/66; 439/65
[58] Field of Search ...................... 439/59, 62, 65, 66, 439/91, 80–83

[56] References Cited

U.S. PATENT DOCUMENTS

| | | | |
|---|---|---|---|
| 4,505,529 | 3/1985 | Barkus | 439/66 |
| 4,634,199 | 1/1987 | Anhalt et al. | 439/66 |
| 4,752,231 | 6/1988 | Olsson | 439/66 |
| 4,838,801 | 6/1989 | Bertoglio et al. | |
| 4,927,369 | 5/1990 | Grabbe et al. | 439/66 |
| 4,961,709 | 10/1990 | Noschese | 439/66 |
| 4,998,886 | 3/1991 | Werner | 439/66 |

*Primary Examiner*—David L. Pirlot
*Attorney, Agent, or Firm*—Victor E. Libert; Frederick A. Spaeth

[57] ABSTRACT

A connector system for providing electrical connection between two mutually opposed arrays of circuit contact pads including a housing (26) having an array of cells (30) corresponding to the arrays of circuit contact pads, with each cell containing a resilient connector element (21). Connector elements (21) are formed from connector blanks (10), each having a bow-shaped body portion (12). The body portion establishes a connector axis (20) and terminates at its opposite ends (14a, 14b) in respective first and second flag members (16a, 16b) which extend axially away from the body portion in respective opposite directions and terminate in electrically conductive contact surfaces, (17a, 17b, 18a, 18b, 56) to establish conductive contact with the circuit contact pads. The body portions (12) are disposed in a serpentine, single layer configuration defining an interior region into which the flag members radially extend.

15 Claims, 3 Drawing Sheets

COMPARATIVE
EXAMPLE

MULTI-CHIP MODULE CONNECTOR ELEMENT AND SYSTEM

FIELD OF THE INVENTION

This invention relates to connector devices for establishing electrical connections between separable electronic component contacts, and more specifically to a connector system adapted to connect parallel arrays of electrical contacts such as are commonly used in integrated circuit chip packages in the computer industry.

BACKGROUND OF THE INVENTION AND RELATED ART

In recent years, the trend toward miniaturization in electronics has given rise to the need for establishing electrical connections between ever smaller components having ever increasing numbers of contact sites. This situation is particularly acute in the computer industry, in which hundreds of thousands of switching circuits can now be disposed on a single chip. As the number of switching circuits on these chips rises, so does the number of contacts through which electrical signals pass into and out of the chip to provide signal communication with other chips and devices which may be mounted, for example, on a common circuit board.

In attempts to provide signal communication to such chips, the chips may be mounted singly or in multiple chip modules in which the electrical leads terminate on the surface of the chip package in a fixed array of contact pads. The circuit board is equipped with a corresponding array of contact pads, and an array of connector elements is disposed between the chip package and the circuit board to provide the necessary electrical connections between the respective pads. For example, U.S. Pat. No. 4,838,801 to Bertoglio et al, dated Jun. 13, 1989, discloses a leadless component socket in which an array of bore holes in a plate-like socket body matches corresponding arrays of electrical contacts on the components to be electrically connected. In each bore hole is disposed a two part connector element with one part extending from each end of the bore hole toward a corresponding electrical contact pad. The two pieces are fitted together so that when the respective contact pads are brought into position, a springing force biases the two parts toward the respective contact pad surfaces.

U.S. Pat. No. 4,961,709 to Noschese dated Oct. 9, 1990, discloses an electrical connector for establishing a connection between spaced printed circuit boards. The connector comprises a metal block dispersed between the circuit boards and equipped with an array of holes. In each hole is disposed a contact spring formed form a stamped Y-shaped member which is spirally coiled with the ends of the arms of the Y wrapped internally in the coil. The base of the Y is disposed in the outermost portion of the coil, and the parts of the arms which protrude from either side of the coil are trimmed to form rounded tips.

SUMMARY OF THE INVENTION

Generally, there is provided in accordance with the present invention a connector element for use in a connector system to establish an electrical connection between a pair of mutually opposed circuit contact pads, each of which is a member of a respective array of such pads which typically form part of an integrated circuit chip package. The connector element has flag members in physical contact with the circuit contact pads and a body portion providing an electrical path between the flag members. The body portion is configured so that it does not have mutually parallel or overlapping surfaces and thereby provides superior signal transmission performance over connector elements of the prior art. The connector elements according to this invention are formed from connector blanks which are described herein below.

Specifically, according to the present invention, there is provided a conductive connector blank for forming a connector element to provide electrical connection between two mutually opposed substrate surfaces. The connector blank comprises a resilient member having a body portion establishing a connector axis and terminating at its opposite ends in respective first and second flag members. The flag members extend axially away from the body portion in respective opposite directions and terminate in electrically conductive contact surfaces for establishing conductive contact with the substrate surfaces. The body portion may be bow-shaped.

According to one aspect of the present invention, the flag members are disposed at an angle of about 90 degrees with respect to the plane of the body portion.

According to another aspect of the present invention, there is provided a connector element comprising a resilient member having a body portion establishing a connector axis and terminating at its opposite ends in respective first and second flag members. The flag members extend axially away from the body portion in respective opposite directions and terminate in electrically conductive contact surfaces for establishing conductive contact with the substrate surfaces. The body portion is disposed in a serpentine, single layer configuration defining an interior region into which the flag members radially extend.

There may be leg members attached respectively to the ends of the resilient member. The leg members extend toward the body portion in respective opposite directions, and each leg member comprises a barb member dimensioned and configured to engage the other barb member upon compression of the flag members toward one another. Optionally, at least one flag member comprises a protuberance to provide better contact with the substrate surface. Similarly, a tab member may be attached to one or both ends of the body portion, extending toward the body portion, to block access into the turns of the body portion and thereby reduce nesting and tangling among connector elements during storage and handling.

In another aspect, the present invention provides a connector system for providing electrical continuity between a first plurality of contacts and a second plurality of contacts, wherein the first and second pluralities are disposed in corresponding parallel planar arrays. Specifically, a connector system according to the present invention comprises a housing defining an array of cells corresponding to the first and second arrays of circuit contact pads, which cell having a top opening and a bottom opening and extending axially between one of the contacts in the first plurality and a corresponding contact in the second plurality, and further comprises a connector element having a single layer serpentine configuration as described above disposed within each cell with the flag members protruding through respective top openings and bottom openings, to establish electrical contact with the pads. According to this aspect of the invention, the housing may define cells having a circular cross-sectional periphery. Alternatively, cells may have a non-circular cross-sectional periphery, to stabilize the connector elements disposed therein in a specific rotational orientation within their respective cells. The housing may be formed from a non-conductive material, preferably a liquid crystal polymer. Optionally, the housing comprises a cell plate defining the cells, a bottom face plate attached to the bottom surface of the cell plate and defining a plurality of holes aligned with the cells and further comprises a top face plate attached to the top surface of the cell plate, and defining a plurality of holes aligned with the cells, wherein the diameters of the holes are smaller than the cross-sectional diameters of the cells but are sufficiently large to allow the flag members to protrude therethrough. Alternatively, the housing comprises a top housing half comprising a top cell plate defining a plurality of connector wells and a plurality of top openings aligned with the wells, and a bottom housing half comprising a bottom cell plate defining a plurality of bottom connector wells and a plurality of bottom holes aligned with the bottom cells. In this case, the top cell plate is dimensioned and configured to be attached to the bottom cell plate so that the bottom wells and top wells cooperate to define the cells.

As used herein and in the claims, the term "single layer", when used in reference to a body portion, describes a configuration in which a radius extending at right angles from a central axis passes only once through the body portion of a given connector element.

DETAILED DESCRIPTION OF SPECIFIC EMBODIMENT

Figure 1:
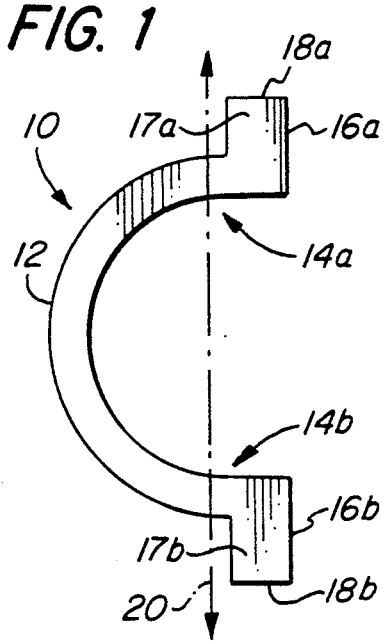
FIG. 1 is a plan view of a connector blank terminating in flag members, according to one embodiment of the present invention.

A connector element according to one embodiment of the present invention is formed from a connector blank 10, shown in FIG. 1, which comprises a resilient member having, in the illustrated embodiment, a bow-shaped body portion 12 which terminates at opposite ends 14a and 14b, which define a connector axis indicated by dot-dash line 20. Flag members 16a and 16b extend from ends 14a and 14b in respective opposite directions away from body portion 12, i.e., away from the center point of body portion 12 along connector axis 20 and terminate in contact edges 18a and 18b, respectively.

Either contact edges 18a and 18b or the faces 17a, 17b of flag members 16a and 16b, or both, provide electrically conductive contact surfaces intended to establish electrical continuity with substrate surfaces, e.g., circuit contact pads, in physical contact with flag members 16a and 16b.

Body portion 2 is also electrically conductive to provide an electrical signal path between flag members 16a and 16b, and accordingly, connector blank 10 is formed from a hardenable highly conductive metal alloy, such as a curious alloy, preferably beryllium-copper, and may be stamped as a blank from a sheet of alloy metal. Body portion 12 thus resembles in FIG. 1 a semi-circular ribbon laid upon a flat surface.

Figure 2:
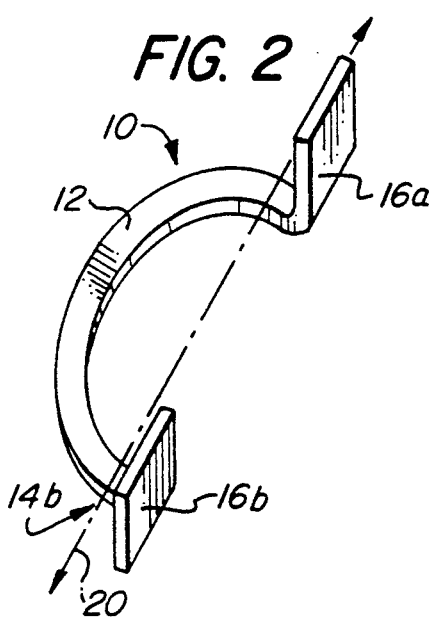
FIG. 2 is an axonometric view of the connector blank of FIG. 1 with the flag members disposed at 90° with respect to the plane of the body portion.
Figure 3A:
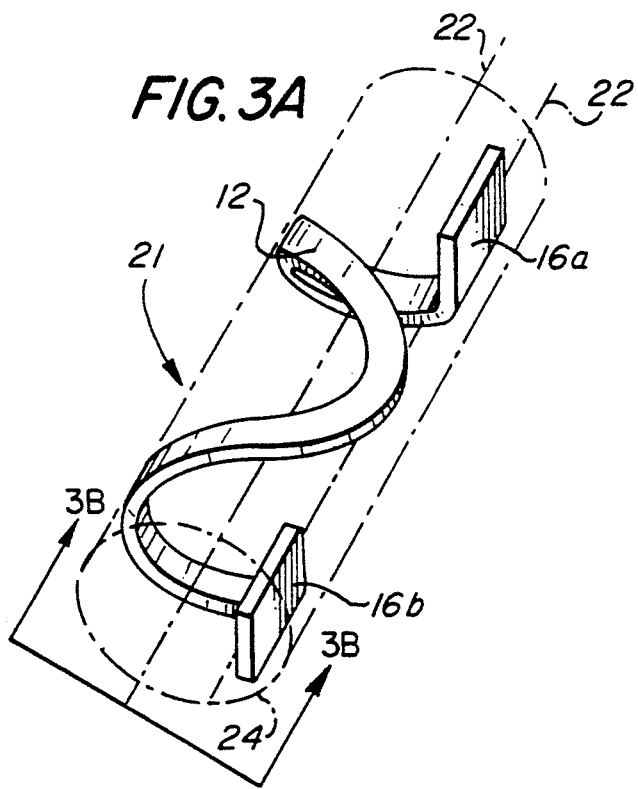
FIG. 3A is an axonometric view of the connector blank of FIG. 2 with the body portion in a serpentine, single layer configuration to form a connector element according to the present invention.
Figure 3B:
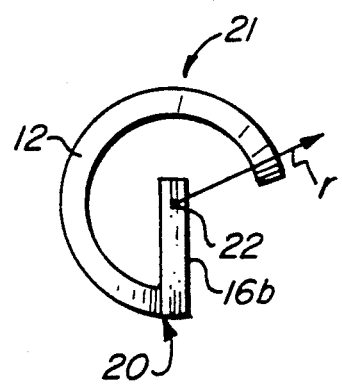
FIG. 3B is an elevational view of the connector element of FIG. 3A taken along line 3B—3B.
Figure 3C:
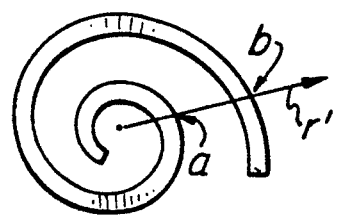
FIG. 3C is a view similar to that of FIG. 3B of a connector element falling outside the scope of the present invention because of the multiple layered radial configuration.

Flag members 16a and 16b are disposed at right angles to the plane in which body portion 12 lies, as shown in FIG. 2, by bending connector blank 10 at approximately a 90 degree angle with respect to the plane of the body portion at or near the connector axis 20. Then the connector element 21 (FIG. 3A) according to this embodiment of the present invention is formed when body portion 12 is curved about a central axis indicated by line 22, which is substantially parallel to the connector axis. The configuration of body portion 12 of connector element 21 can be described as a semi-circular ribbon laid upon the surface of an imaginary cylinder indicated in dot-dash outline as cylinder 24, with flag members 16a and 16b extending radially towards the center of the cylinder and axially away from body portion 12. The body portion thus follows a serpentine path curving about and extending along a central axis, thus defining a cylindrical interior region into which flag members 16a and 16b extend. Preferably, flag members 16a and 16b extend to the center of the interior region. The body portion 12 is configured so that no part of body portion 12 overlays another part along a radius extending outwardly from the central axis, i.e. body portion 12 is coiled without radial overlay of one part over another. Specifically, body portion 12 is configured so that any radius "r" emanating at right angles from central axis 22, FIG. 3B, passes through body portion 12 only once. Such a configuration is also referred to herein as a single layer configuration, and is distinguished from multi-layered configurations in which a given radius "r'" may pass through the body portion of the connector element two or more times, as seen in FIG. 3C at points "a" and "b". While the serpentine, single layer configuration of the connector element according to this embodiment of the present invention is described as defining a cylindrical interior region, i.e., a region having a circular cross section, this should not be viewed as a limitation on the present invention. It will be understood that the interior regions defined by the body portion of the connector elements according to the present invention need not have circular cross sections. For example, the body portion may define an interior region having an elliptical, ovid, polygonal, or other cross-sectional configuration, as long as the body portion follows a serpentine path and lies in a single layer configuration. All such interior regions are encompassed by the term "generally cylindrical". Therefore, body portions of connector elements according to the present invention, like connector element 21, have no parallel conducting surfaces and accordingly exhibit little capacitive reactance while carrying a single, thus improving single clarity and transmission speed over connectors which rae coiled in multi-layered configurations with radially overlaying surfaces. In addition, the serpentine path followed by body portion 12 serves to minimize the extent to which any given segment of body portion 12 will be disposed beside another segment n an adjacent winding even within the single layer. In other words, by disposing body portion 12 in a serpentine path, connector element 21 has fewer and more widely separated parallel windings than a conventional helix. This reduces the degree to which inductive reactance and capacitance reactance effect signal transmission within each given connector element. Connector elements according to the present invention may be produced in a progressive stamping die in a manner known to those skilled in the art.

Figure 4:
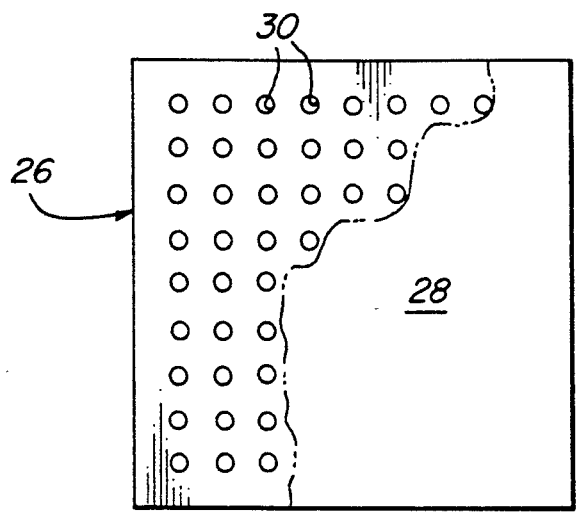
FIG. 4 is a plan view of a housing for a connector system according to this invention showing part of the array of cells in the housing.

In another aspect, the present invention provides a connector system comprising a housing as shown in FIG. 4 used in conjunction with connector elements according to this invention. Housing 26 has a substantially flat top surface 28, a substantially flat bottom surface (not shown) parallel to surface 28 and is equipped with a plurality of cells 30 which extend like bore holes through housing 26 from top surface 28 to the bottom surface. Top surface 28, the bottom surface and the array of cells 30 in housing 26 correspond to matched array of circuit contact pads, one or both arrays of which may be, for example, on a circuit board, a multi-chip module or an integrated circuit chip package.

Figure 5:
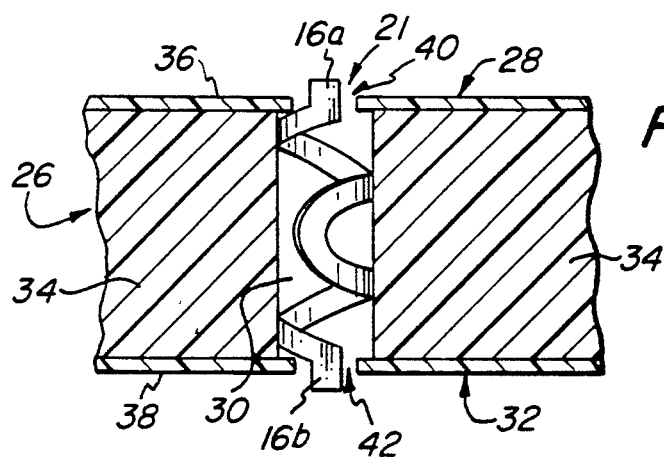
FIG. 5 is a partially cross-sectional elevational view of a connector system according to one embodiment of the present invention.

A connector element 21 is disposed within a typical cell 30, as shown in FIG. 5, with housing 26 serving as a template to hold the connector elements in positions corresponding to the arrays of circuit contact pads. In addition, housing 26 serves to provide electrical insulation between connector elements. To serve this purpose, housing 26 is preferably formed from a non-conductive material, such as a liquid crystal polymer, to provide electrical insulation between elements. Alternatively, housing 26 may be made of a conductive material, provided that each cell is equipped with an insulative sleeve within which the respective connector elements are disposed, so that connector elements 21 are electrically insulated from the housing. The thickness of housing 26 is dimensioned so that flags 16a and 16b extend beyond top surface 28 and bottom surface 32 of housing 26 in the absence of a compressive force brining flag members 16a and 16b toward one another. In the embodiment shown in FIG. 5, housing 26 comprises a cell plate 34, a top face plate 36 attached to the top of cell plate 34 and a bottom face plate 38 attached to the bottom of cell plate 34. Top face plate 36 and bottom face plate 38 are each equipped with corresponding arrays of flag apertures 40 and 42, respectively. Flag apertures 40 and 42 are smaller in diameter than the cross-sectional diameter of cells 30, but are nevertheless dimensioned to allow flag members 16a and 16b to protrude therethrough. In this way, circuit contact pads bearing against respective flag member 16a and 16b can exert a force bringing flag members 16a and 16b closer together to the degree to which they protrude from top surface 28 and bottom surface 32, respectively.

When the circuit contact pads are first placed in contact with flag members 16a and 16b, and are then forced toward one another so that they bar against to surface 28 and bottom surface 32, respectively, flag members 16a and 16b are thereby moved closer to one another and thus exert a compressive force upon body portion 12. Body portion 12, being a resilient member, yields to the compressive force but responds with a resistive force, so that flag members 16a and 16b press against their respective circuit contact pads. This resilience is due in part to the bow-shaped configuration of the body portion of the connector blank from which connector element 21 was formed. However, it would be understood by those skilled in the art that other configurations of body portion 12 will provide resiliency to the connector element. For example, body portion 12 may be S-shaped and otherwise disposed in a single layer configuration defining an interior region into which flag members extend, and that such a connector element would exhibit resiliency as with a connector element formed from a blank having a bow-shaped body portion. It is believed that when disposed in an array as described below, the generally cylindrical serpentine configuration of the connector elements according to this invention exhibit less inductive reactance, capacitive reactance and cross talk than an array of flat connectors due to the reduced incidence of adjacent connector elements having parallel surfaces.

Figure 6:
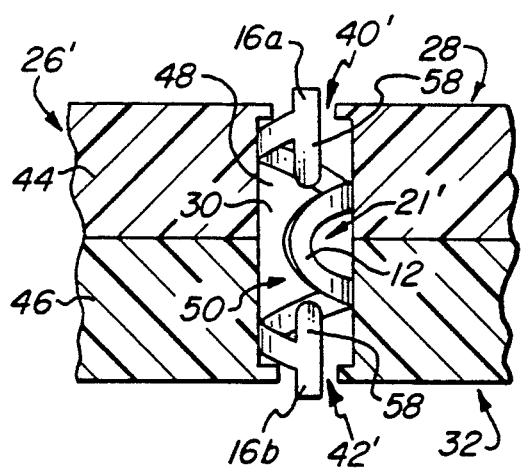
FIG. 6 is a view similar to that of FIG. 5 of another embodiment of a connector system according to the present invention.

In an alternative embodiment shown in FIG. 6 in which structures corresponding to those in the embodiment of FIG. 5 are identically numbered, except for the use of a prime indicator where the structures differ, housing 26' comprises a top housing half 44 and a bottom housing half 46. Top housing half 44 defines a plurality of stepped cell wells 48, and bottom half 46 defines an array of stepped cell wells 50. Cell wells 48 and 50 cooperate to form cells 30 in which connector elements 21' are disposed, and provide flag apertures 40' and 42', respectively, to enclose connector elements 21' within cells 30 while allowing flag members 16a and 16b to protrude beyond top surface 28 and bottom surface 32, respectively. In this embodiment, connector element 21' includes optional tabs 58 extending from the ends of body portion 12 axially toward body portion 12. Tabs 58 serve to reduce handling problems by preventing nesting and entanglement among and between connector elements 21' during handling and the assembly process described below by blocking the helical space defined by body portion 12, thus preventing insertion therein by other connector elements.

Connector elements 21 can be deposited into cells 30 by conventional methods known in the art, e.g., vibratory insertion methods, into a fixture having a plurality of chambered bore holes closed at the narrow ends by a removable panel. In one vibratory insertion method, a plurality of connector elements is placed upon top surface of the fixture which is then vibrated to induce the connector elements to fall into the bore holes. When there is one connector element in each bore hole, the fixture is positioned so that, in the case of housing 26 of FIG. 5, the bore holes are aligned with housing cells 30, and the panel is removed, allowing the connector elements to fall into the cells. For this purpose, housing 26 is only partially constructed: bottom face plate 38 is fixed to cell pate 34 so that the connector elements do not fall out, but top face plate 36 is not yet attached, so that the connector elements can enter the cells. After connector elements 21 are disposed within the respective cells 30, top face plate 36 is attached to cell plate 34, enclosing the connector elements but allowing the flag members to protrude beyond the top and bottom surfaces of housing 26. In assembling the embodiment shown in FIG. 6, connector elements 21' are placed into cell wells 50 of bottom housing half 46, after which top housing half 44 is fixed into position on top of bottom housing half 46 to secure connector elements 21' into position and to form housing 26'.

Figure 7:
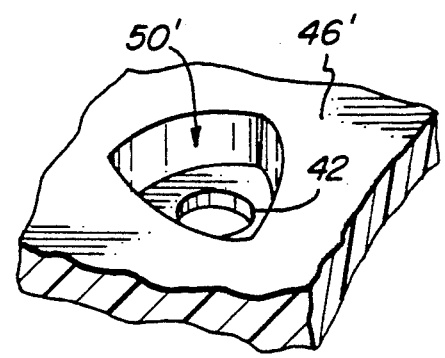
FIG. 7 is a perspective view of a non-circular cell in a bottom housing half according to the present invention.

As shown in FIG. 4, cells 30 all have a circular cross-sectional peripheral configuration. With circular cross-sectional peripheral configurations, there is not radial orientation of connector elements within cells 30 which is more stable upon compression than any other radial orientation. However, cells 30 may have a non-circular peripheral configuration, such as the curvate triangular peripheral configuration. In such an embodiment, the hosing may comprise a bottom housing half 46' having a bottom cell well 50' as shown in FIG. 7. The non-circular configuration serves to retain body portion 12 of connector elements 21 in a fixed position within cells 30 when flag members 16a and 16b are compressed by respective circuit contact pads. This is because compression of a body portion having a serpentine, single layer configuration according to the present invention causes distortion of the configuration of the body portion. The walls of a cell having anon-circular peripheral configuration vary radially in their distance from the center of the cell, so that in certain radial positions, the compressed and thus radially distorted connector elements will experience less stress due to contact with the cell walls in certain rotational positions than in other positions. Therefore, the connector elements will tend, upon compression, to stably orient themselves within cells having non-circular peripheral configurations to a redial position which minimizes stress between the connector element and the cell wall. Since the movement of flag members 16a and 16b toward one another and the resulting compression of body portion 12 causes a winding or torquing effect between body portion 12 and flag members 16a and 16b, the stabilizing effect of the non-circular periphery of cells 30 translates the torquing effect into a wiping or scraping action by contact edges 18a and 18b of flag members 16a and 16b against the respective circuit contact pads. This wiping or scraping action serves to remove insulative surface oxide layers which may form on the surfaces of circuit contact pads during pre-assembly storage. The removal of the oxide films in this manner promotes better electrical conductivity between the pads and the flag members.

Connector elements 21 and cells 30 may be dimensioned and configured to provide an array of up to about 400 connections per square inch, i.e., about 64 connections per square centimeter. Preferably, connector elements 21 and housing 26 are dimensioned and configured so that the circuit contact pads compress flag members 16a and 16b to the point where the circuit contact pads rest on respective top and bottom surfaces of housing 26 with from about 70 to 400 grams of compressive force for each connector element. More preferably, each connector element may require about 100 to 175 grams of compressive force for such compression. A compressive force of about this magnitude, complemented by the scraping or wiping action described above, is generally sufficient to penetrate the oxide layer mentioned above, but is not forceful enough to cause contact edge 18a and 18b to tear into the surface of conventional circuit contact pads. The compressive force required for a given degree of displacement can be varied in ways known in the art including, for example, varying the thickness of the stock from which connector elements are stamped, and/or the width of the body portions.

Figure 8A:
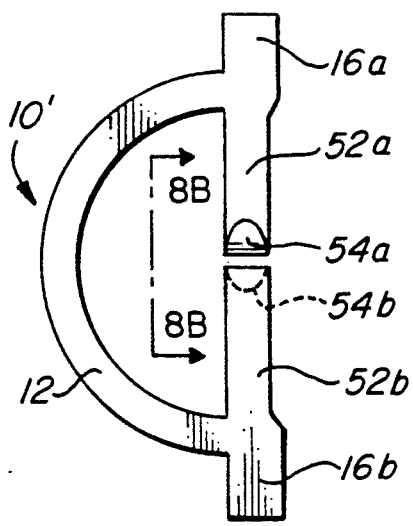
FIG. 8A is a plan view of a connector blank including barbed leg members according to another embodiment of the present invention.
Figure 8B:
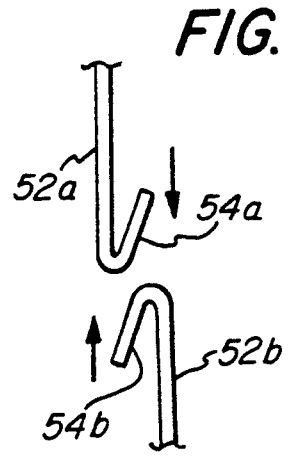
FIG. 8B is an enlarged elevational view of the barbed leg members of FIG. 8A taken along line 8B—8B.
Figure 9:
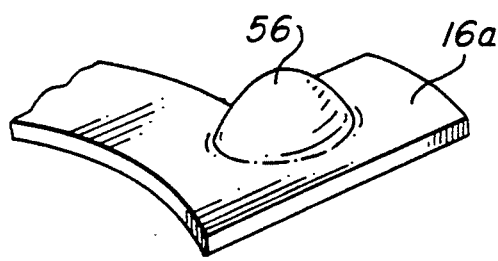
FIG. 9 is a perspective view of a mammilated flag member according to the present invention.
Figure 8C:
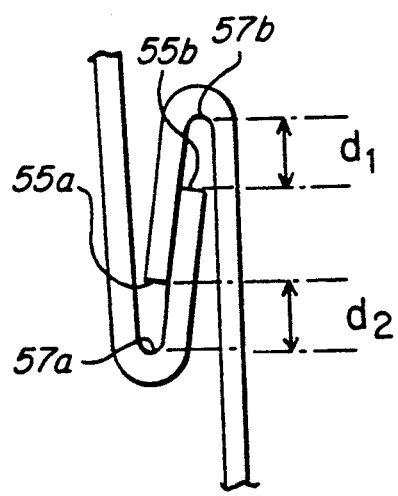
FIG. 8C is an enlarged view of the barbed leg members of FIG. 8B with the barbs engaged.

Connector blank 10', FIG. 8A, includes electrically conductive leg members 52a and 52b which are attached to connector blank 10' at the opposite ends of body portion 12 and extend toward each other in respective opposite directions. Leg member 52a is equipped with a hook-like barb 54a which is bent backwards away from leg member 52b. Likewise, leg member 52b is equipped with a barb 54b, shown in dotted outline, which is also bent backwards, away from leg member 52a, as best seen in FIG. 8B. Leg members 52a and 52b and barbs 54a and 54b are formed in a coining operation and are dimensioned and configured so that when body portion 12 is compressed by moving flag members 16a and 16b toward one another, barbs 54a and 54b couples with one another and remain engaged when the compression is released. This coupling compression is performed prior to inserting the connector element to the housing described below, and exceeds the compression imposed by circuit contact pads disposed against the top and bottom surfaces of the housing. Barbs 54a and 54b are dimensioned and configured so that after the coupling compression is released, leaving body portion 12 in a relaxed state as shown in FIG. 8C, they do not disengage when the flag ends are compressed by the circuit contact pads. In addition, barbs 54a and 54b are dimensioned and configured so that in the relaxed engaged state, there are sufficient tolerances $d_1$ and $d_2$ to allow the circuit contact pads to move the flag members together until the pads rest on their respective top and bottom surfaces of the housing within jamming tips 55a and 55b of barbs 54a and 54b into bends 57a or 57b. Since leg members 52a and 52b and barbs 54a and 54b are electrically conductive with flag members 16a and 16b, the result of this coupling is that a single passing between circuit contact pads has a path straight through legs 52a, 52b from one circuit contact pad to the other, as opposed to following the curved path provided by bow-shaped body portions 12. Thus, the signal path and corresponding signal speed through the connector system are shortened.

According to still another embodiment of the present invention, one or both of flag members 16a and 16b may be mammilated to form a protuberance 56 which provides the electrically conductive contact surface for contact with a circuit contact pad. In this embodiment, the flag member is bent at an angle in relation to the connector axis, so that upon compression by the circuit contact pads, flag member 16a bends to dispose protuberance 56 against the pad surface. Protuberance 56 provides improved hertzian stress, and in combination with the wiping action described above, results in superior surface contact for electrical signal transmission. Signal transmission may be enhanced even more by plating the mammilated flag member with gold. Since connector elements according to this invention can be stamped from a metal sheet, the flag members can be conveniently and efficiently plated by strip plating the stock sheets prior to stamping.

While the present invention has been described with respect to particular embodiments, it will be understood by those skilled in the art that these and other embodiments fall within the spirit of the invention and within the scope of the following claims.

What is claimed is:

1. A conductive connector blank for forming a connector element to provide an electrical connection between two mutually opposed substrate surfaces, the blank comprising:

a resilient member having a body portion establishing a connector axis and terminating at its opposite ends in respective distinct first and second flag members, the flag members extending axially away from the body portion in respective opposite directions, the flag members being disposed at an angle of about 90 degrees with respect to the plane of the body portion and in a plane substantially parallel to the connector axis and terminating in electrically conductive contact surfaces for establishing conductive contact with the substrate surfaces.

2. The connector blank of claim 1 wherein the body portion is bow-shaped.

3. A connector element for establishing an electrical connection between two mutually opposed substrate surfaces, comprising:

a resilient member having a body portion establishing a connector axis and terminating at its opposite ends in respective first and second flag members, the flag members extending axially away from the body portion in respective opposite directions and terminating in electrically conductive contact surfaces for establishing conductive contact with the substrate surfaces, the body portion being disposed in a serpentine, single layer configuration curving about a central axis to define an interior region into which the flag members extend.

4. The connector element of claim 3 wherein the flag members comprise a protuberance to provide better contact with the substrate surface.

5. A connector element for establishing an electrical connection between two mutually opposed substrate surfaces, comprising:

a resilient member having a body portion establishing a connector axis and terminating at its opposite ends in respective first and second flag members, the flag members extending axially away from the body portion in respective opposite directions and terminating in electrically conductive contact surfaces for establishing conductive contact with the substrate surfaces, the body portion being disposed in a serpentine, single layer configuration defining an interior region into which the flag members extend, and further comprising leg members attached respectively to one of an end of the resilient member or to a flag member and extending toward each other with each leg member comprising a barb member dimensioned and configured to engage the other barb member upon compression of the flag members.

6. The connector element of claim 3 further comprising a tab member attached to at least one end of the body portion, and extending axially toward the body portion, to block access into the turns of the body portions and thereby reduce nesting and tangling among connector elements during storage and handling.

7. The connector element of claim 6 comprising a tab member attached to each end of the body portion with each tab member extending axially toward the other.

8. A connector system for providing electrical continuity between a first plurality of circuit contact pads and a second plurality of circuit contact pads, wherein the first and second pluralities are disposed in corresponding parallel planar arrays, the system comprising:

a housing defining an array of cells corresponding to the first and second arrays of contacts, each cell having a top opening and a bottom opening for extending axially between one of the contacts in the first plurality and a corresponding contact in the second plurality; and connector elements disposed within said cells, said connector elements comprising a resilient member having a body portion establishing a connector axis and terminating at its opposite ends in respective first and second flag members, the flag members extending axially away from the body portion in respective opposite directions and terminating in electrically conductive contact surfaces, and protruding through the top openings and bottom openings, respectively, for establishing conductive contact with the pads, wherein the body portion is disposed in a serpentine, single layer configuration curving about a central axis to define an interior region into which the flag members radially extend.

9. The connector system of claim 8 wherein the housing defines cells having non-circular cross-sectional peripheries, to stabilize the connector elements disposed therein in a specific rotational orientation within the cells.

10. The connector system of claim 8 wherein the flag members comprise a protuberance to provide improved electrical continuity with the contacts.

11. The connector system of claim 8 wherein each flag member further comprises a tab attached to an end of the body portion and extending axially toward the body portion to block access into turns of the body portion and thereby to reduce nesting and tangling among connector elements during storage and handling.

12. The connector system of claim 8 wherein the housing comprises a cell plate defining the cells, a bottom face plate attached to the bottom surface of the cell plate and defining a plurality of holes aligned with the cells and further comprises a top face plate attached to the top surface of the cell plate, the top face plate defining a plurality of holes aligned with the cells, wherein the diameters of the holes are smaller than the cross-sectional diameters of the cells but are sufficiently large to allow thee flag members to protrude therethrough.

13. The connector system of claim 12 wherein the housing comprises a top housing half comprising a top cell plate defining a plurality of top cell wells and a plurality of top openings aligned with the wells, and wherein the housing further defines a bottom housing half comprising a bottom cell plate defining a plurality of bottom cell wells and a plurality of bottom holes aligned with the bottom wells, with the top cell plate dimensioned and configured to be attached to the bottom cell plate so that the bottom wells and top wells cooperate to define said cells.

14. A connector system for providing electrical continuity between a first plurality of circuit contact pads and a second plurality of circuit contact pads, wherein the first and second pluralities are disposed in corresponding parallel planar arrays, the system comprising:
   a housing defining an array of cells corresponding to the first and second arrays of contacts, each cell having a top opening and a bottom opening for extending axially between one of the contacts in the first plurality and a corresponding contact in the second plurality; and
   connector elements disposed within said cells, said connector elements comprising a resilient member having a body portion establishing a connector axis and terminating at its opposite ends in respective first and second flag members, the flag members extending axially away from the body portion in respective opposite directions and terminating in electrically conductive contact surfaces, and protruding through the top openings and bottom openings, respectively, for establishing conductive contact with the pads, wherein the body portion is disposed in a serpentine, single layer configuration defining an interior region into which the flag members radially extend, wherein each connector element further comprises leg members attached to opposite respective ends of a body portion and extending toward one another, each leg member comprising a barb member dimensioned and configured to engage the barb member on the other leg member upon the release of a coupling compressive force greater than a contact compressive force.

15. The connector system of claim 14 wherein the housing comprises a cell plate defining the cells, a bottom face plate attached to the bottom surface of the cell plate and defining a plurality of holes aligned with the cells and further comprises a top face plate attached to the top surface of the cell plate, the top face plate defining a plurality of holes aligned with the cells, wherein the diameters of the holes are smaller than the cross-sectional diameters of the cells but are sufficiently large to allow the flag members to protrude therethrough.

* * * * *